United States Patent
Choi et al.

(10) Patent No.: US 7,402,491 B2
(45) Date of Patent: Jul. 22, 2008

(54) METHODS OF MANUFACTURING A SEMICONDUCTOR DEVICE INCLUDING A DIELECTRIC LAYER INCLUDING ZIRCONIUM

(75) Inventors: Han-Mei Choi, Seoul (KR); Kyoung-Ryul Yoon, Gyeonggi-do (KR); Seung-Hwan Lee, Seoul (KR); Ki-Yeon Park, Seoul (KR); Sung-Tae Kim, Seoul (KR); Young-Sun Kim, Gyeonggi-do (KR); Cha-Young Yoo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 250 days.

(21) Appl. No.: 11/261,737

(22) Filed: Oct. 28, 2005

(65) Prior Publication Data

US 2006/0094191 A1    May 4, 2006

(30) Foreign Application Priority Data

Oct. 28, 2004    (KR) .................... 10-2004-0086419

(51) Int. Cl.
    *H01L 21/336*    (2006.01)
(52) U.S. Cl. .................... 438/257; 438/261; 438/264
(58) Field of Classification Search ................. 438/261, 438/264, 257, 593, 239, 258, 263, 266
See application file for complete search history.

(56) References Cited

U.S. PATENT DOCUMENTS

| | | | |
|---|---|---|---|
| 6,632,279 B1 * | 10/2003 | Ritala et al. ................. 117/101 |
| 6,750,066 B1 | 6/2004 | Cheung et al. ................. 438/3 |
| 6,754,108 B2 | 6/2004 | Forbes ................... 365/185.25 |
| 6,780,704 B1 * | 8/2004 | Raaijmakers et al. ....... 438/239 |
| 6,844,604 B2 | 1/2005 | Lee et al. .................... 257/410 |
| 2002/0135048 A1 * | 9/2002 | Ahn et al. .................... 257/632 |
| 2003/0043637 A1 | 3/2003 | Forbes et al. ........... 365/185.33 |
| 2003/0048666 A1 | 3/2003 | Eldridge et al. ........ 365/185.28 |
| 2005/0280067 A1 * | 12/2005 | Ahn et al. .................... 257/310 |
| 2006/0043504 A1 * | 3/2006 | Ahn et al. .................... 257/410 |

FOREIGN PATENT DOCUMENTS

KR    1020030014499 A    2/2003

OTHER PUBLICATIONS

Kaupo Kukli, Low-Temperature Deposition of Zirconium Oxide-Based Nanocrystalline Films by Alternate Supply of Zr[OC(CH3)3]4 and H2O, Apr. 7, 2000, Department of Chemistry-University of Helsinki.*
Notice to Submit a Response for Korean patent application No. 10-200-0086419 mailed on Jan. 31, 2006.
English Translation of the Notice to Submit a Response for Korean patent application No. 10-200-0086419 mailed on Jan. 31, 2006.

* cited by examiner

*Primary Examiner*—Kevin M Picardat
(74) *Attorney, Agent, or Firm*—Myers Bigel Sibley & Sajovec, P.A.

(57) ABSTRACT

A method of manufacturing a semiconductor device can include forming a tunnel oxide layer on a substrate, forming a floating gate on the tunnel oxide layer and forming a dielectric layer pattern on the floating gate using an ALD process. The dielectric layer pattern can include a metal precursor that includes zirconium and an oxidant. A control gate can be formed on the dielectric layer pattern. The semiconductor device can include the dielectric layer pattern provided herein.

15 Claims, 7 Drawing Sheets

METHODS OF MANUFACTURING A SEMICONDUCTOR DEVICE INCLUDING A DIELECTRIC LAYER INCLUDING ZIRCONIUM

CROSS-REFERENCE TO RELATED APPLICATION

This application claims priority under 35 USC §119 to Korean Patent Application No. 2004-86419, filed Oct. 28, 2004, the disclosure of which is incorporated herein by reference in its entirety.

FIELD OF THE INVENTION

The present invention relates to methods of manufacturing semiconductor devices. More particularly, the present invention relates to methods of manufacturing nonvolatile semiconductor memory devices.

BACKGROUND OF THE INVENTION

A flash memory device is generally known as a type of a nonvolatile semiconductor memory device and may include a tunnel oxide layer, a floating gate, a dielectric layer and a control gate.

The flash memory device may be programmed by injecting electrons into the floating gate while applying a predetermined voltage to the control gate. The dielectric layer may transfer the applied voltage to the floating gate and may hold the electrons in the floating gate. Furthermore, the flash memory device having the dielectric layer may have a high coupling ratio so as to prevent a loss of the applied voltage. Thus, the loss of the applied voltage may be reduced in accordance with an increase of the coupling ratio of the flash memory device.

The coupling ratio (R) is may be represented by the following equation (1).

$$R = C_1 / (C_1 + C_2) \quad (1)$$

In the above equation (1), $C_1$ represents the capacitance of the dielectric layer, and $C_2$ represents the capacitance of the tunnel oxide layer. Additionally, the capacitance of the dielectric layer $C_1$ may be obtained by the following equation (2).

$$C_1 = (\in \times A)/T \quad (2)$$

In the above equation (2), $\in$ denotes a dielectric constant of the dielectric layer, and A represents an area of the dielectric layer. Additionally, T indicates a thickness of the dielectric layer.

To increase the coupling ratio of the flash memory device, the dielectric layer may have a high dielectric constant $\in$, a large area A and/or a thin thickness T. High coupling ratios may be achieved by employing a dielectric material formed using a high-k dielectric material such as tantalum oxide ($Ta_2O_5$), yttrium oxide ($Y_2O_3$), hafnium oxide ($HfO_2$), zirconium oxide ($ZrO_2$), niobium oxide ($Nb_2O_5$), barium titanate ($BaTiO_3$) or strontium titanate ($SrTiO_3$).

When the dielectric layer of the flash memory device is formed using hafnium oxide, ingredients in the dielectric layer may crystallize at a temperature of above about 300° C. thereby generating a leakage current from the dielectric layer. Thus, the use of hafnium oxide to form the dielectric layer of the flash memory device may not be advantageous.

Considering the above-mentioned problem, the dielectric layer of the flash memory device may be formed using zirconium oxide since zirconium oxide may have a relatively high crystalline temperature and/or a relatively thin equivalent oxide thickness (EOT). Examples of methods for forming a dielectric layer using zirconium oxide are discussed in U.S. Patent Application Publication No. 2003/0043637, U.S. Pat. No. 6,750,066 (issued to Cheung et al.) or U.S. Pat. No. 6,754,108 (issued to Forbes). U.S. Pat. No. 6,750,066 discusses a dielectric layer having a thickness of about 10 Å to about 200 Å using zirconium oxide.

SUMMARY OF THE INVENTION

According to some embodiments of the present invention, there is provided a method of manufacturing a semiconductor device wherein, a tunnel oxide layer pattern is formed on a substrate. After a floating gate is formed on the tunnel oxide layer pattern, a dielectric layer pattern having a first thin film pattern is formed on the floating gate. The first thin film pattern may be formed using an atomic layer deposition process with a first oxidant and a first metal precursor wherein the first metal precursor may include zirconium. A control gate may be subsequently formed on the dielectric layer pattern.

In some embodiments of the present invention, the dielectric layer pattern may include a second thin film pattern formed on the first thin film pattern. The second thin film pattern may be formed using a second oxidant and a second metal precursor, wherein the second metal precursor may include aluminum.

In some embodiments of the present invention, the dielectric layer pattern may have a multi layer structure in which at least one first thin film pattern and at least one second thin film pattern are formed on the floating gate.

According to some embodiments of the present invention, there is provided a method of manufacturing a semiconductor device wherein, after a tunnel oxide layer is formed on a substrate, a first conductive layer may be formed on the tunnel oxide layer. A dielectric layer having a first thin film may be formed on the first conductive layer, wherein the first thin film may include zirconium oxide. The first thin film may be formed using an atomic layer deposition process with a first oxidant and a first metal precursor, wherein the first metal precursor may include zirconium. A second conductive layer may be formed on the dielectric layer. The second conductive layer, the first thin film, the first conductive layer and the tunnel oxide layer may be etched to form a tunnel oxide layer pattern, a floating gate, a dielectric layer pattern having a first thin film pattern and a control gate on the substrate.

In some embodiments of the present invention, the dielectric layer pattern may be formed by forming a second thin film pattern on the first thin film pattern using a second oxidant and a second metal precursor, wherein the second metal precursor may include aluminum.

According to some embodiments of the present invention, a dielectric layer that may include zirconium oxide may have, for example, such characteristics as, a higher crystalline temperature, a higher dielectric constant, a decreased equivalent oxide thickness (EOT), and/or a low leakage current density, and the like. Accordingly, the semiconductor device including the dielectric layer according to embodiments of the present invention may have improved electrical characteristics, for example, a higher coupling ratio and/or a higher storage capacitance.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents and other references mentioned herein are incorporated by reference in their entirety.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

FIGS. 1A through 1D are cross-sectional views illustrating methods of manufacturing a semiconductor device in accordance with some embodiments of the present invention.

Figure 1A:
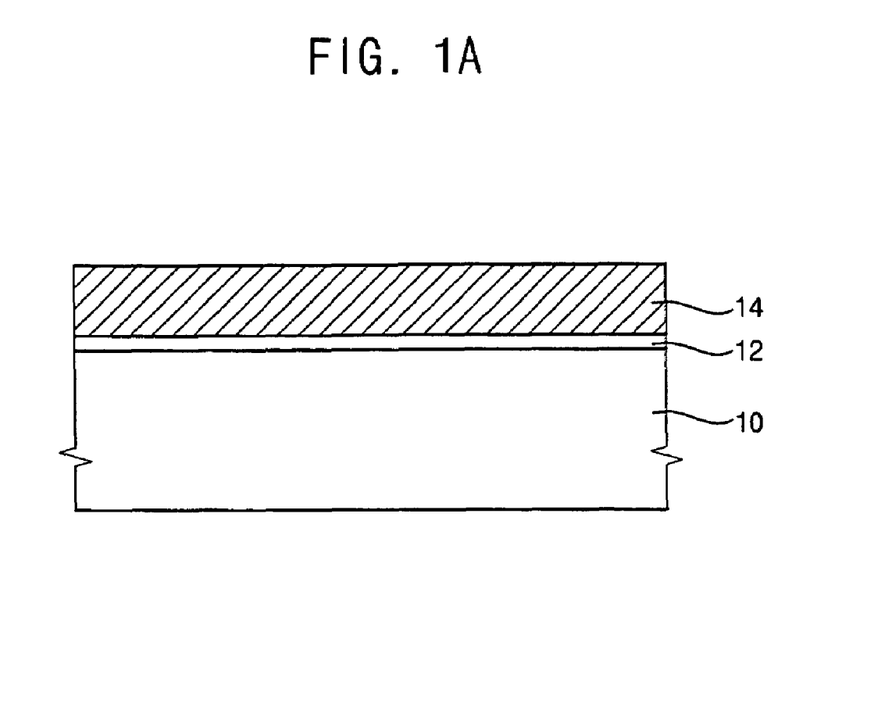
FIGS. 1A through 1D are cross-sectional views illustrating a method of manufacturing a semiconductor device according to some embodiments of the present invention.

Referring to FIG. 1A, an isolation layer is formed on a substrate 10 such as a silicon wafer or a silicon on insulator (SOI) substrate. The isolation layer defines an active region and a field region of the substrate 10. The isolation layer may be formed by an isolation process such as a shallow trench isolation (STI) process or a local oxidation of silicon (LOCOS) process.

A tunnel oxide layer 12 is formed on the substrate 10. The tunnel oxide layer 12 may be formed by a thermal oxidation process or a radical oxidation process. In some embodiments, a thickness of the tunnel oxide layer 12 may be in the range from about 10 Å to about 500 Å, as measured from an upper face of the substrate 10. In other embodiments of the present invention, the tunnel oxide layer 12 may have a thickness of about 100 Å.

A first conductive layer 14 is formed on the tunnel oxide layer 12. The first conductive layer 14 may be formed using a conductive material including, but not limited to, a metal, a conductive metal nitride or polysilicon doped with impurities. The first conductive layer 14 may be formed using, for example, titanium (Ti), titanium nitride (TiN), aluminum (Al), aluminum nitride (AlN), tantalum (Ta), tantalum nitride (TaN), tungsten (W), tungsten nitride (WN), titanium aluminum nitride (TiAlN), or a combination thereof.

The first conductive layer 14 may be formed on the tunnel oxide layer 12 by processes including, but not limited to, a chemical vapor deposition (CVD) process, a sputtering process, a pulse laser deposition (PLD) process, an atomic layer deposition (ALD) process, and the like.

In some embodiments of the present invention, the first conductive layer 14 is formed using doped polysilicon. The first conductive layer 14 may be formed by first forming a polysilicon layer on the tunnel oxide layer 12 and second doping impurities into the polysilicon layer. The forming of the polysilicon layer may be performed in a furnace using a silane ($SiH_4$) gas by a thermal decomposition process. The doping may be executed by a diffusion process or an ion implantation process after the polysilicon layer is formed. Alternatively, the impurities may be doped in-situ in the polysilicon layer while forming the polysilicon layer.

In further embodiments of the present invention, the first conductive layer 14 is formed using the metal or the conductive metal nitride. In this case, the first conductive layer 14 is formed by the CVD process, the sputtering process, the PLD process, the ALD process, and the like.

Figure 1B:
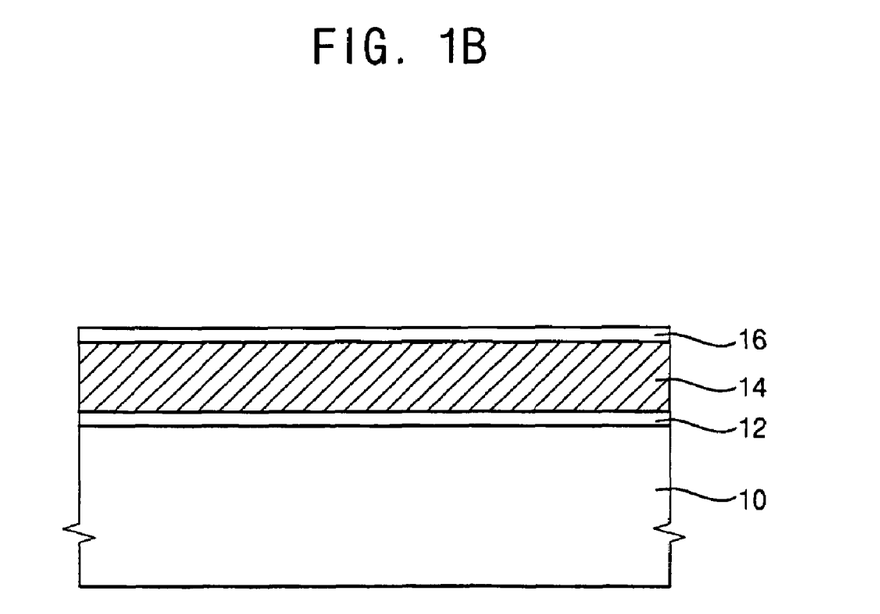

Referring to FIG. 1B, a dielectric layer 16 is formed on the first conductive layer 14. The dielectric layer 16 may be formed using a material having a high dielectric constant.

In other embodiments of the present invention, the dielectric layer 16, which includes a first thin film, is formed by an ALD process using a first metal precursor and a first oxidant. Examples of the first metal precursor may include, but are not limited to tetrakis methyl ethyl amino zirconium (TEMAZ; $Zr[N(CH_3)(C_2H_5)]_4$)), $ZrCl_4$, $Zr(n-OC_4H_9)_4$, or a combination thereof. Examples of the first oxidant may include, but are not limited to, an ozone ($O_3$) gas, an oxygen ($O_2$) gas, a water ($H_2O$) vapor, an oxygen ($O_2$) plasma, a remote oxygen ($O_2$) plasma, or a combination thereof.

The dielectric layer 16, which includes the first thin film, may have a thickness in a range from about 200 Å to about 600 Å measured from the first conductive layer 14. Since the dielectric layer 16 according to the present invention has a thickness greater than that of a conventional dielectric layer including zirconium oxide ($ZrO_2$), the dielectric layer 16 may be used advantageously as a dielectric layer of a nonvolatile semiconductor memory device such as a flash memory device. If a dielectric layer is formed in a volatile semiconductor memory device, such as a dynamic random access memory (DRAM) device, the dielectric layer may not be formed sufficiently on a bottom electrode of the volatile semiconductor memory device since the bottom of a volatile semiconductor memory device may have relatively high stepped portions. In contrast, in some embodiments of the present invention, since the first conductive layer 14 formed over the substrate 10 has a substantially level surface, the dielectric layer 16 formed may be formed more readily on the first conductive layer 14 using the first metal precursor.

The dielectric layer 16 including the first thin film may be formed at a temperature in a range from about 200° C. to about 320° C. Additionally, the dielectric layer 16 may be formed under a pressure in a range from about 0.1 Torr to about 3.0 Torr.

When the dielectric layer 16 is formed at a temperature of below about 150° C., the first metal precursor and the first oxidant may not readily react with each other, so that a formation rate of the dielectric layer 16 may be lowered. When the dielectric layer 16 is formed at a temperature of above about 400° C., the dielectric layer 16 may have the characteristics that result from a CVD process rather than an ALD process. In particular, materials included in the dielectric layer 16 may be rapidly crystallized at temperatures of above about 400° C. In some embodiments of the present invention, the dielectric layer 16, which including includes the first thin film, may be formed at a temperature in a range from about 250° C. to about 280° C. providing the dielectric layer 16 with the desirable characteristics resulting from an ALD process.

Figure 1C:
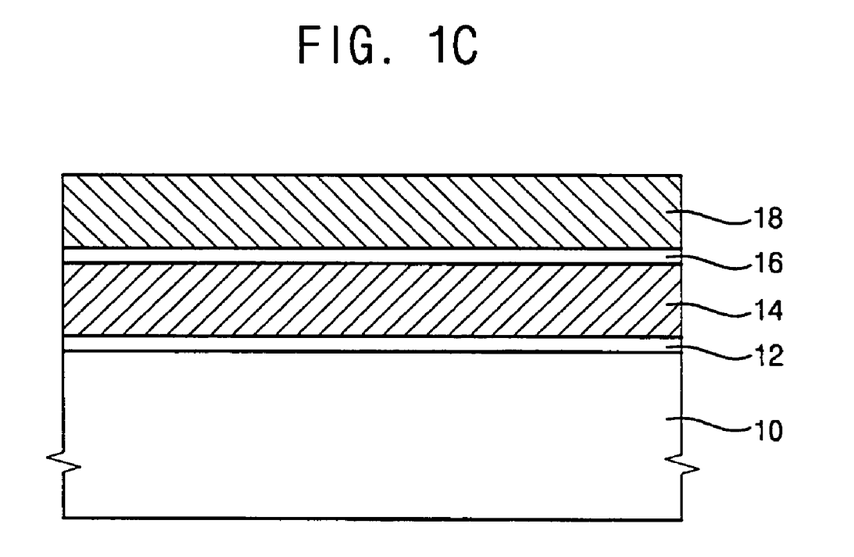

Referring to FIG. 1C, a second conductive layer 18 is formed on the dielectric layer 16. The second conductive layer 18 may be formed using a conductive material substantially identical to that of the first conductive layer 14. For example, the second conductive layer 18 may be formed from material including, but not limited to, doped polysilicon, titanium, titanium nitride, aluminum, aluminum nitride, tantalum, tantalum nitride, tungsten, tungsten nitride, titanium aluminum nitride, or a combination thereof. In addition, the second conductive layer 18 may be formed on the dielectric layer 16 by processes including, but not limited to, a CVD process, a sputtering process, a PLD process, an ALD process, and the like.

Figure 1D:
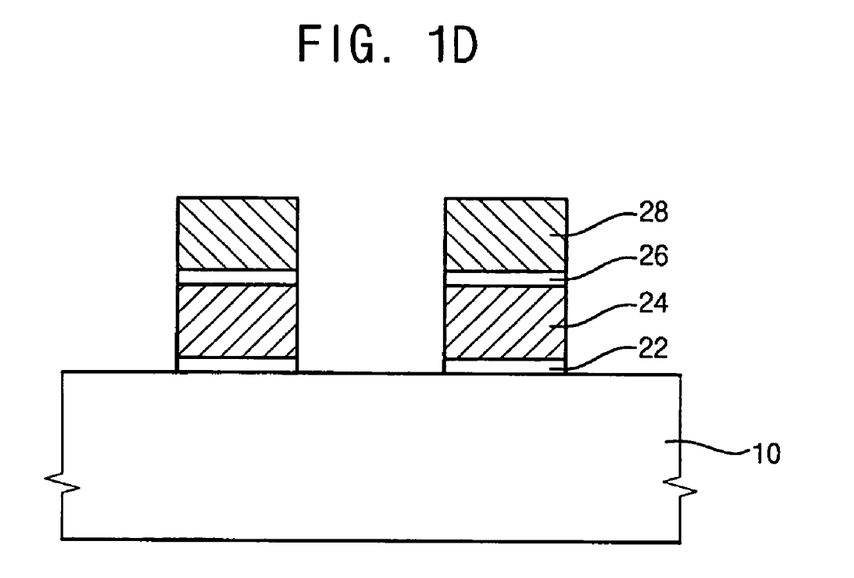

Referring to FIG. 1D, the second conductive layer 18, the dielectric layer 16, the first conductive layer 14, and the tunnel oxide layer 12 are partially etched so that a tunnel oxide layer pattern 22, a floating gate 24, a dielectric layer pattern 26 and a control gate 28 are sequentially formed on the substrate 10. As a result, a nonvolatile semiconductor memory device including the tunnel oxide layer pattern 22, the floating gate 24, the dielectric layer pattern 26, and the control gate 28 is formed on the substrate 10.

Hereinafter, a method of forming a dielectric layer according to some embodiments of the present invention will be described in greater detail with reference to the accompanying drawings.

Figure 2A:
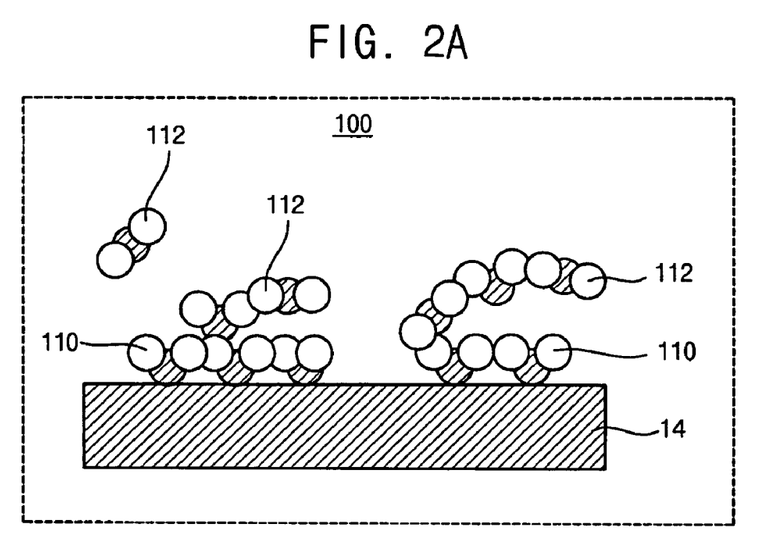
FIGS. 2A through 2E are cross-sectional views illustrating a method of forming a dielectric layer according to some embodiments of the present invention.

FIGS. 2A to through 2E are cross-sectional views illustrating a method of forming a dielectric layer in accordance with some embodiments of the present invention. The dielectric layer includes a first thin film formed using a first metal precursor and a first oxidant, wherein the first metal precursor may include TEMAZ and the first oxidant may be an ozone gas.

Referring to FIG. 2A, a substrate 10 is loaded into a chamber 100. The substrate 10 includes a tunnel oxide layer 12 and a first conductive layer 14 formed by processes substantially identical to those described with reference to FIG. 1A. The chamber 100 may have a temperature in a range from about 250° C. to about 280° C. and a pressure in a range from about 0.1 Torr to about 3.0 Torr.

The first metal precursor, which may include TEMAZ, is provided onto the first conductive layer 14 of the substrate 10 positioned in the chamber 100. In some embodiments, the first metal precursor may be introduced into the chamber 100 for a time period in a range from about 0.5 seconds to about 3 seconds. According to further embodiments, the first metal precursor may be provided onto the first conductive layer 14 of the substrate 10 for about 1 second. After the first metal precursor is placed onto the first conductive layer 14, a first portion 110 of the first metal precursor is chemically adsorbed (i.e., chemisorbed) to the first conductive layer 14, whereas a second portion 112 of the first metal precursor may be physically adsorbed (i.e., physisorbed) to the first portion 110 of the first metal precursor. Therefore, according to some embodiments of the invention, the second portion 112 of the first metal precursor is physically adsorbed to the first portion 110 of the first metal precursor but is not chemisorbed to the first conductive layer 14. Thus, the second portion 112 is coupled to the first conductive layer 14 via the first portion 110 of the first metal precursor. In addition, the second portion 112 of the first metal precursor may drift in the chamber 100.

Figure 2B:
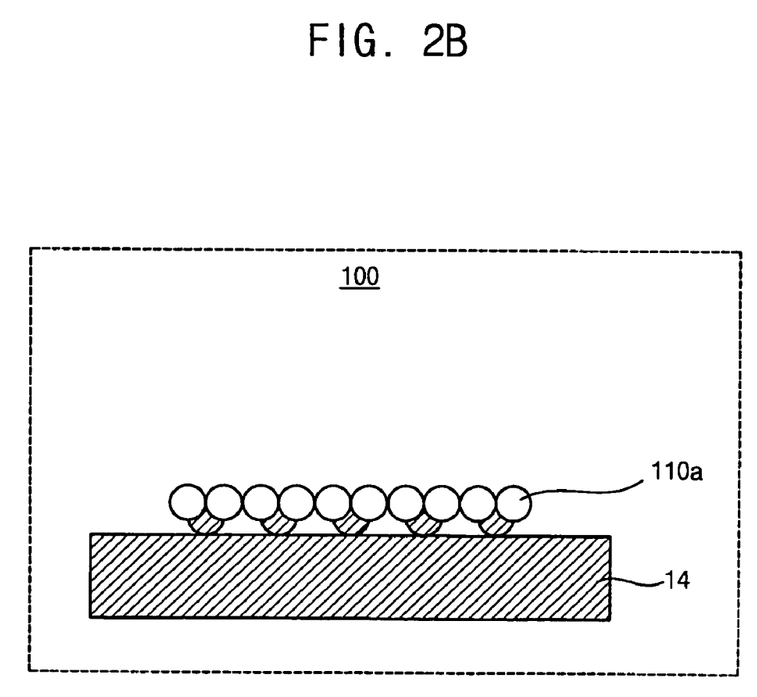

Referring to FIG. 2B, a first purge gas is introduced into the chamber 100. The first purge gas may include an inactive gas such as an argon (Ar) gas or a nitrogen ($N_2$) gas. In some embodiments, the first purge gas may be provided into the chamber 100 for a time period in a range from about 0.5 seconds to about 20 seconds. The first purge gas may also be introduced into the chamber 100 for a time period in a range from about 3 seconds to about 15 seconds. In further embodiments, the first purge gas may be provided into the chamber 100 for a time period in a range from about 7 seconds to about 10 seconds.

When the first purge gas is introduced into the chamber 100, the drifting and physisorbed second portion 112 of the first metal precursor is removed from the chamber 100 and the chemisorbed first portion 110 of the first metal precursor. Therefore, an adsorption film 110a is formed on the first conductive layer 14.

In some embodiments of the present invention, the chamber 100 may be vacuumized for a time period in a range from about 2 seconds to about 10 seconds instead of introducing the first purge gas, thereby removing the second portion 112 of the first metal precursor from the chamber 100.

In some embodiments of the present invention, the chamber 100 may be vaccumized while providing the first purge gas so as to effectively remove the second portion 112 of the first metal precursor.

Figure 2C:
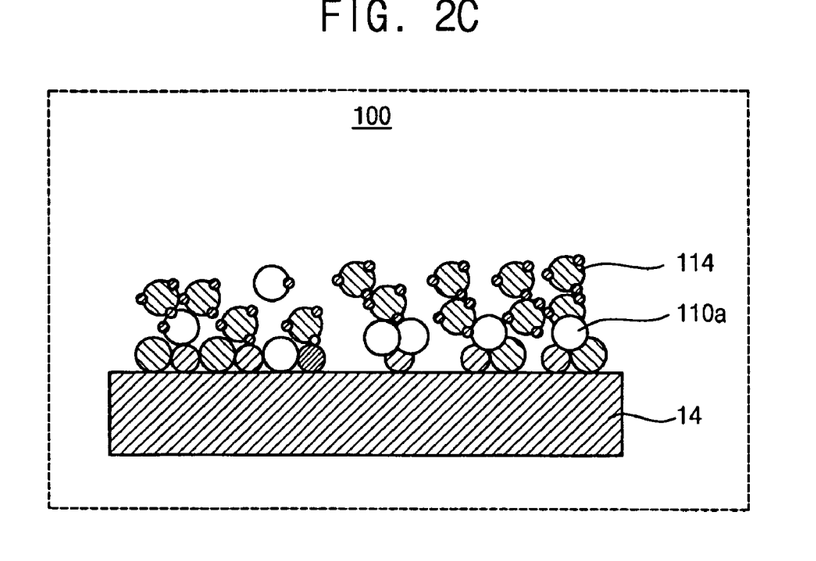

Referring to FIG. 2C, the first oxidant 114, which may include an ozone gas, may be provided onto the adsorption film 110a for a time period in a range from about 1 second to about 7 seconds. In other embodiments, the first oxidant 114 may be introduced into the chamber 100 for about 5 seconds. When the first oxidant 114 is provided onto the adsorption film 110a, materials in the adsorption film 110a are chemically reacted with the first oxidant so that the adsorption film 110a is oxidized.

Figure 2D:
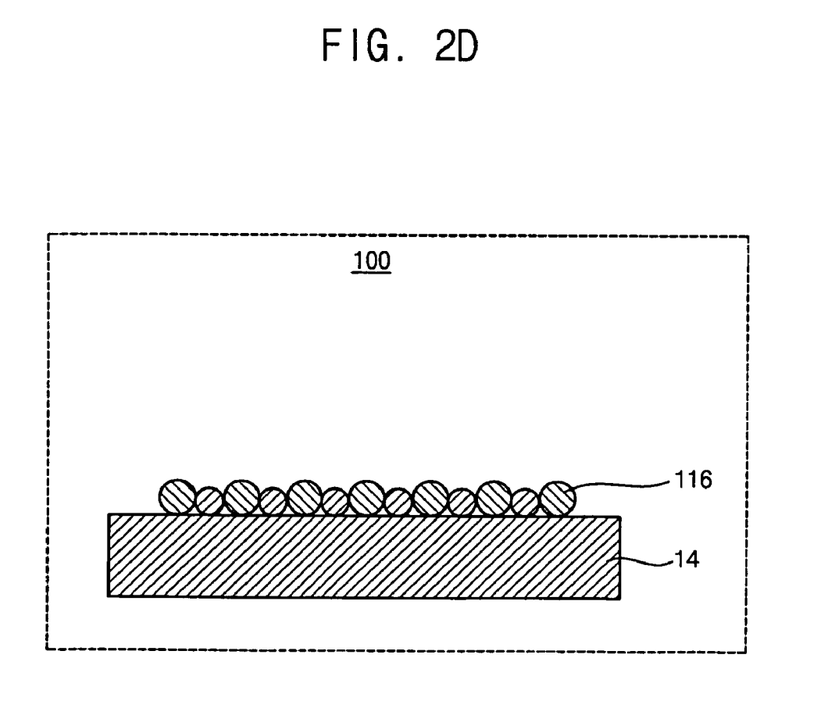

Referring to FIG. 2D, a second purge gas is introduced into the chamber 100. The second purge gas may include an inactive gas such as an argon gas or a nitrogen gas. The second purge gas may be introduced into the chamber 100 for a time period in a range from about 0.5 seconds to about 20 seconds. In some embodiments, the second purge gas may be preferably introduced into the chamber 100 for a time period in a range from about 3 seconds to about 15 seconds. In some embodiments, the second purge gas may be introduced into the chamber 100 for a time period in a range from about 7 seconds to about 10 seconds.

When the second purge gas is introduced into the chamber 100, unreacted first oxidant is removed from the chamber 100. Thus, a preliminary first thin film 116 including which may include zirconium oxide is formed on the first conductive layer 14.

Figure 2E:
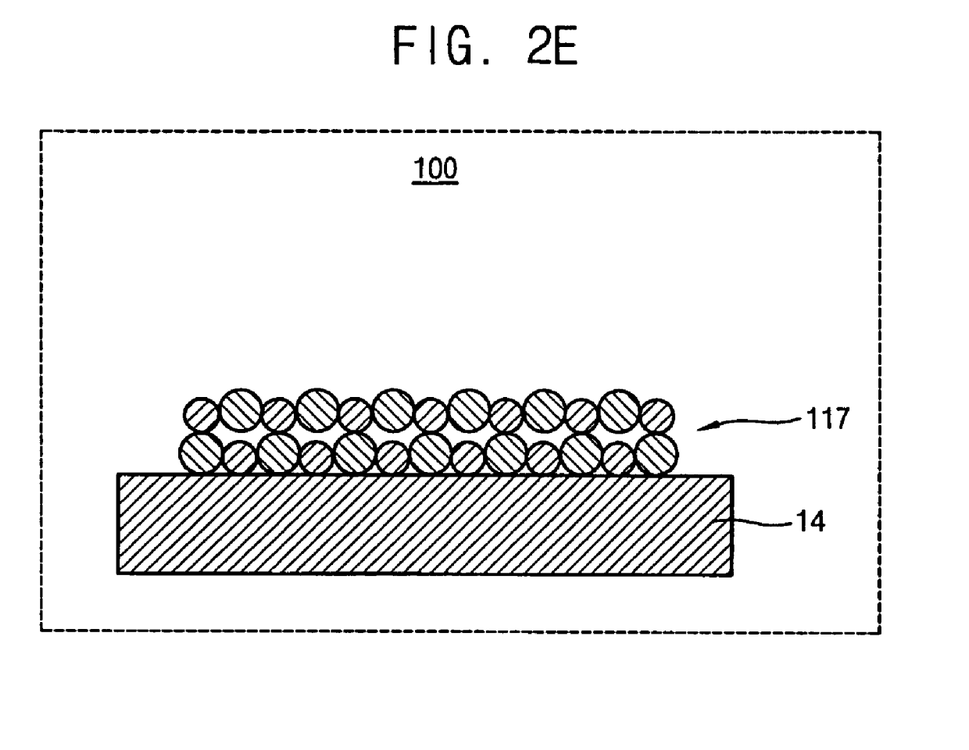

Referring to FIG. 2E, the processes described with reference to FIGS. 2A through 2D may be repeatedly performed at least once so that the dielectric layer including a first thin film 117 is formed on the first conductive layer 14.

When the dielectric layer, which includes the first thin film 117, is formed by an ALD process using the first metal precursor that may include TEMAZ, the dielectric layer may have a higher crystalline temperature and/or a decreased equivalent oxide thickness (EOT). In addition, this dielectric layer may have a dielectric constant of above about 30. Hence, a nonvolatile semiconductor memory device employing such a dielectric device may have improved characteristics such as a higher coupling ratio.

According to some embodiments of the present invention, the dielectric layer may further include a second thin film formed on the first thin film 117. The second thin film may be formed using a second metal precursor and a second oxidant. An ALD process also may be used to form the second thin film.

An example of the second metal precursor may include, but is not limited to, trimethyl aluminum ($Al(CH_3)_3$; TMA). Examples of the second oxidant may include, but are not limited to, an ozone gas, an oxygen gas, a water vapor, an oxygen plasma, a remote oxygen plasma or a combination thereof. The second thin film may be formed on the first thin film 117 by processes substantially identical to those described with reference to FIGS. 2A to 2E excluding the use of for the second metal precursor including TMA.

Figure 3:
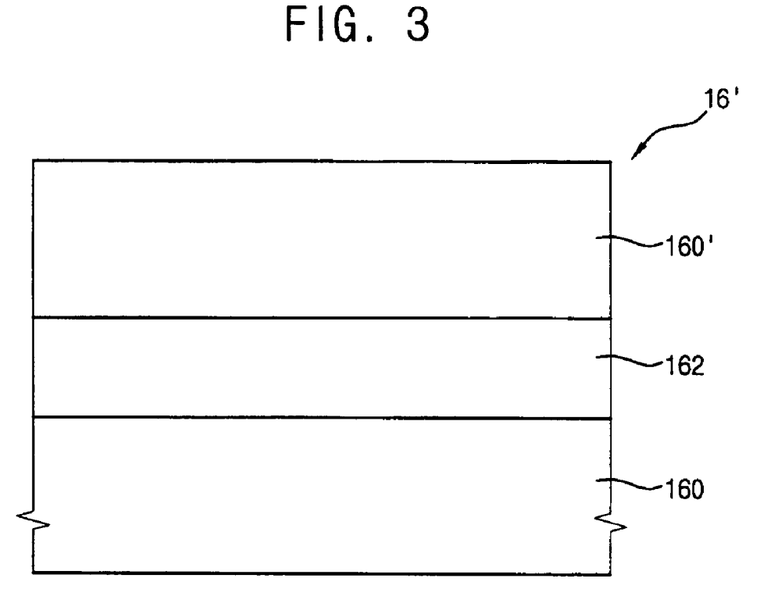
FIGS. 3 and 4 are cross-sectional views illustrating a dielectric layer having a multi layer structure according to some embodiments of the present Invention.

FIG. 3 is a cross-sectional view illustrating a dielectric layer having a multi layer structure in accordance with some embodiments of the present invention.

Referring to FIG. 3, a dielectric layer 16' includes a first thin film 160, a second thin film 162 formed on the first thin film 160 and an additional thin film 160' formed on the second thin film 162. The first thin film 160, which may include zirconium oxide, may have a thickness of about 150 Å by performing the ALD process at least once to achieve the desired thickness. The second thin film 162, which may include aluminum oxide, may have a thickness of about 70 Å by executing the ALD process at least once to achieve the desired thickness. The additional thin film 160', which may include zirconium oxide, also may have a thickness of about 150 Å by performing the ALD process at least once to achieve the desired thickness.

In some embodiments of the present invention, the dielectric layer 16' may have another multi layer structure in which at least one first thin film 160 and at least one second thin film 162 are alternately formed.

Figure 4:
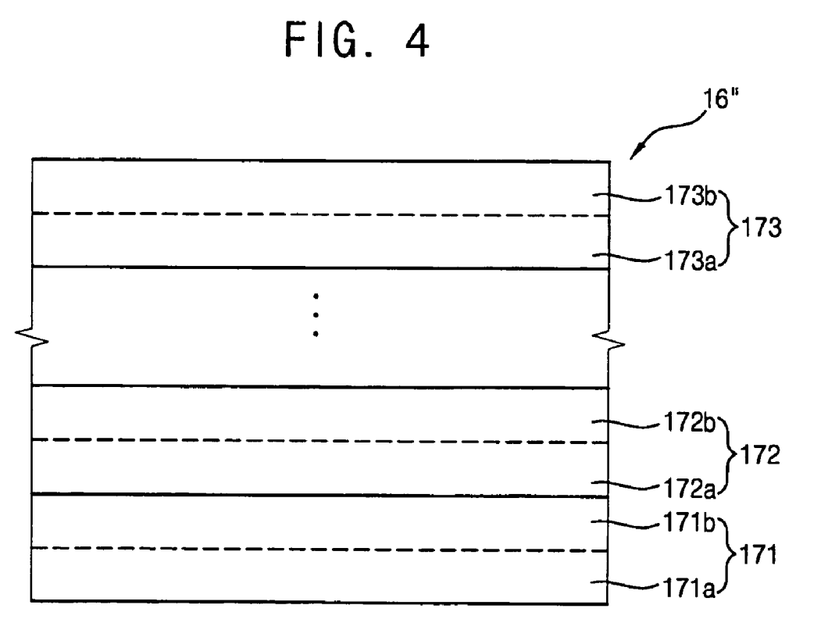

FIG. 4 is a cross-sectional view illustrating a dielectric layer having a multi layer structure in accordance with some embodiments of the present invention.

Referring to FIG. 4, a dielectric layer 16" has a multi layer structure that includes a first to an Nth (N is an integer greater than 2) unit cells 171, 172 and 173. The first unit cell 171 includes a first thin film 171a and a second thin film 171b. The second unit cell 172 includes an additional first thin film 172a and an additional second thin film 172b. In this manner, the Nth unit cell 173 includes an Nth first thin film 173a and an Nth second thin film 173b. In other words, the dielectric layer 16" includes a plurality of first thin films 171a, 172a and 173a and a plurality of second thin films 171b, 172b and 173b. The first and the second thin films 171a, 172a, 173a, 171b, 172b and 173b are alternately formed on one another. Thus, the dielectric layer 16" has the multi layer structure that includes a plurality of first thin films 171a, 172a and 173a and a plurality of second thin films 171b, 172b and 173b, which are alternately disposed.

In some embodiments of the present invention, the isolation layer may be formed after forming the tunnel oxide layer pattern 22 and the floating gate 24 on the substrate 10.

As described above, the dielectric layer pattern 26 has a higher dielectric constant, a higher crystalline temperature and/or a decreased EOT, thus, providing improved electrical characteristics in a nonvolatile semiconductor memory device, which incorporates the above described dielectric layer according to some embodiments of the present invention.

EXAMPLE

Measurements of Electrical Characteristics of Dielectric Layers

A dielectric layer including zirconium oxide was formed at a temperature of about 275° C. by repeatedly performing an ALD process. The dielectric layer had an EOT of about 9.5 Å. In the ALD process, a metal precursor that included TEMAZ was introduced for about 3 seconds, and then a first purge gas including an argon gas was introduced for about 10 seconds. Subsequently, an oxidant including an ozone gas was introduced for about 5 seconds, and a second purge gas including an argon gas was introduced for about 10 seconds.

COMPARATIVE EXAMPLE

A dielectric layer including hafnium oxide was formed at a temperature of about 300° C. by repeatedly performing an ALD process. The dielectric layer had an EOT of about 12.7 Å. In the ALD process, a metal precursor that included tetrakis diethyl amino hafnium (TDEAH) was introduced for about 3 seconds, and then a first purge gas including an argon gas was introduced for about 10 seconds. Then, an oxidant including an ozone gas was introduced for about 5 seconds, and a second purge gas including an argon gas was introduced for about 10 seconds.

Figure 5:
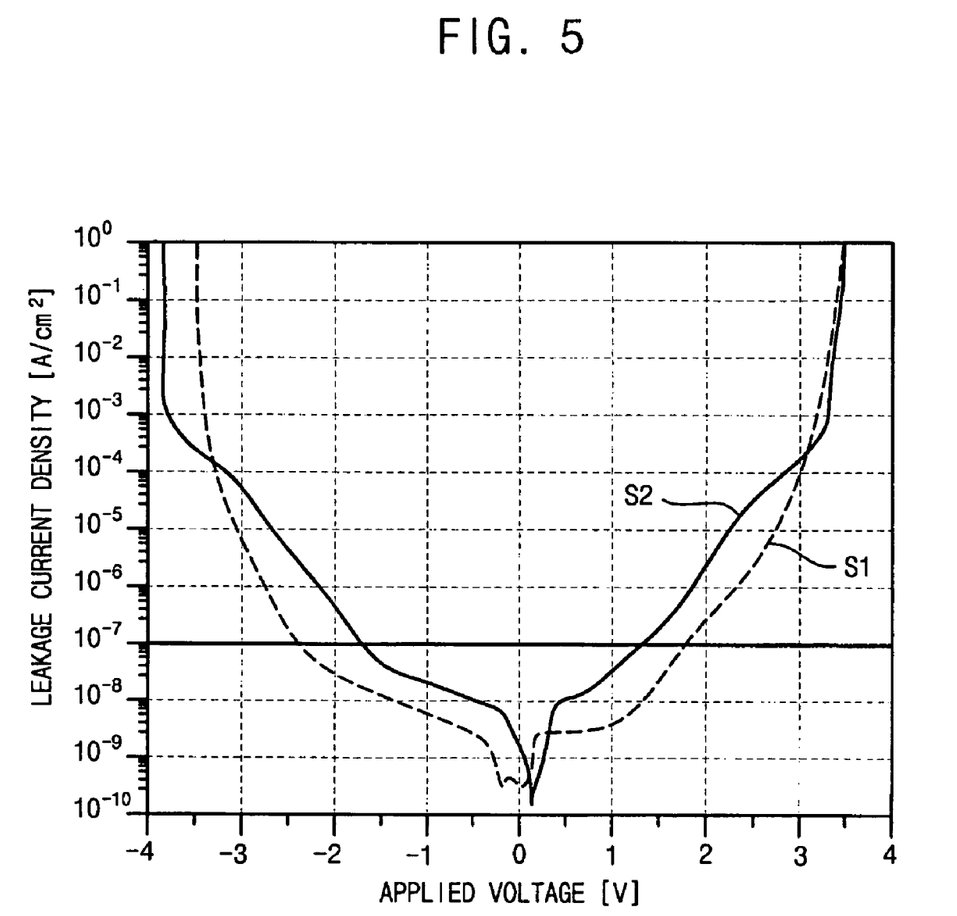
FIG. 5 is a graph illustrating leakage current densities of dielectric layers according to some embodiments of the present invention and a Comparative Example.

FIG. 5 illustrates leakage current densities of the dielectric layers relative to applied voltages according some embodiments of the present invention provided into the Example and the Comparative Example. In FIG. 5, "S1" represents the leakage current density of the representative dielectric layer of the Example, and "S2" represents the leakage current density of the dielectric layer of the Comparative Example.

As shown in FIG. 5, the representative dielectric layer S1 of the Example has a leakage current density lower than that of the dielectric layer S2 of the Comparative Example. Accordingly, the dielectric layer S1 of the Example has improved electrical characteristics. In addition, the representative dielectric layer S1 of the Example has a relatively thin EOT, indicating that the dielectric layer has a capacitance that is higher than that of the dielectric layer S2 of the Comparative Example. When a nonvolatile semiconductor memory device includes the a dielectric layer such as the representative dielectric layer of S1 of the Example, the nonvolatile semiconductor memory device may have enhanced electrical characteristics, for example, a higher coupling ratio and/or a higher storage capacitance.

A dielectric layer, formed using zirconium oxide and an ALD process according to the some embodiments of the present invention, may have improved characteristics such as a decreased EOT, a higher dielectric constant, a higher crystalline temperature, and a lower leakage current density. Incorporation of such a dielectric layer in a nonvolatile semiconductor memory device may result in the nonvolatile semiconductor memory device also having the same enhanced electrical characteristics and/or a higher storage capacitance.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a non-volatile memory cell comprising:
    forming a tunnel oxide layer pattern on a substrate;
    forming a floating gate on the tunnel oxide layer pattern;
    forming a dielectric layer pattern comprising a composite of multiple dielectric layers by forming
        a first thin film pattern on the floating gate using a first oxidant and a first metal precursor comprising zirconium; then
        forming a second thin film pattern on the first thin film pattern using a second oxidant and a second metal precursor comprising aluminum; and then
        repeating the sequence of said forming a first thin film pattern and forming a second thin film pattern at least twice; and
    forming a control gate on the dielectric layer pattern.

2. The method of claim 1, wherein the floating gate comprises doped polysilicon, titanium, titanium nitride, tantalum, tantalum nitride, tungsten, tungsten nitride, aluminum, aluminum nitride, titanium aluminum nitride, or a combination thereof.

3. The method of claim 1, wherein the first metal precursor comprises $Zr[N(CH_3)(C_2H_5)]_4$, $ZrCl_4$ $Zr(n-OC_4H_9)_4$, or a combination thereof, and the first oxidant comprises an ozone ($O_3$) gas, an oxygen ($O_2$) gas, a water ($H_2O$) vapor, an oxygen ($O_2$) plasma, a remote oxygen ($O_2$) plasma, or a combination thereof.

4. The method of claim 1, wherein the dielectric layer pattern has a thickness in a range from about 200 Å to about 600 Å.

5. The method of claim 1, wherein the dielectric layer pattern is formed at a temperature in a range from about 150° C. to about 450° C.

6. The method of claim 1, wherein the dielectric layer pattern is formed at a pressure in a range from about 0.1 Torr to about 3 Torr.

7. The method of claim 1, wherein the control gate comprises doped polysilicon, ruthenium, iridium, titanium, titanium nitride, tantalum, tantalum nitride, tungsten, tungsten nitride, aluminum, aluminum nitride, titanium aluminum nitride, or a combination thereof.

8. The method of claim 1, wherein the second metal precursor comprises trimethyl aluminum (TMA), and the second oxidant comprises an ozone ($O_3$) gas, an oxygen ($O_2$) gas, a water ($H_2O$) vapor, an oxygen ($O_2$) plasma, a remote oxygen ($O_2$) plasma, or a combination thereof.

9. A method of manufacturing a non-volatile memory cell comprising:
    forming a tunnel oxide layer on a substrate;
    forming a first conductive layer on the tunnel oxide layer;
    forming a dielectric layer comprising a composite of multiple dielectric layers by:
        forming a first thin film on the first conductive layer using a first oxidant and a first metal precursor comprising zirconium, forming a second thin film on the first thin film using a second oxidant and a second metal precursor comprising aluminum; and repeating the sequence of said forming a first thin film pattern and forming a second thin film pattern at least twice;

forming a second conductive layer on the dielectric layer; and etching the second conductive layer, the dielectric layer, the first conductive layer and the tunnel oxide layer to form a tunnel oxide layer pattern, a floating gate, a dielectric layer pattern comprising a multi layer thin film pattern and a control gate.

10. The method of claim 9, wherein the second conductive layer, the first thin film, the first conductive layer and the tunnel oxide layer are partially etched.

11. The method of claim 9, wherein the first conductive layer comprises doped polysilicon, titanium, titanium nitride, tantalum, tantalum nitride, tungsten, tungsten nitride, aluminum, aluminum nitride, titanium aluminum nitride, or a combination thereof.

12. The method of claim 9, wherein the first metal precursor comprises $Zr[N(CH_3)(C_2H_5)]_4$, $ZrCl_4$, $Zr(n\text{-}OC_4H_9)_4$, or a combination thereof, and the first oxidant comprises an ozone ($O_3$) gas, an oxygen ($O_2$) gas, a water ($H_2O$) vapor, an oxygen ($O_2$) plasma, a remote oxygen ($O_2$) plasma, or a combination thereof.

13. The method of claim 9, wherein the dielectric layer pattern has a thickness in the range from about 200 Å to about 600 Å.

14. The method of claim 9, wherein the second conductive layer comprises doped polysilicon, ruthenium, iridium, titanium, titanium nitride, tantalum, tantalum nitride, tungsten, tungsten nitride, aluminum, aluminum nitride, titanium aluminum nitride, or a combination thereof.

15. The method of claim 9, wherein the second metal precursor comprises trimethyl aluminum (TMA), and the second oxidant comprises an ozone ($O_3$) gas, an oxygen ($O_2$) gas, a water ($H_2O$) vapor, an oxygen ($O_2$) plasma, a remote oxygen ($O_2$) plasma, or a combination thereof.

* * * * *